United States Patent
Wu et al.

(10) Patent No.: US 6,970,394 B2
(45) Date of Patent: Nov. 29, 2005

(54) PROGRAMMING METHOD FOR ELECTRICAL FUSE CELL AND CIRCUIT THEREOF

(75) Inventors: Shien-Yang Wu, Hsinchu (TW); Jhon-Jhy Liaw, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 34 days.

(21) Appl. No.: 10/829,689

(22) Filed: Apr. 22, 2004

(65) Prior Publication Data

US 2005/0237841 A1   Oct. 27, 2005

(51) Int. Cl.[7] .............................................. G11C 7/00
(52) U.S. Cl. ....................... 365/225.7; 365/96
(58) Field of Search .............................. 365/225.7, 96, 365/200

(56) References Cited

U.S. PATENT DOCUMENTS

| | | | | |
|---|---|---|---|---|
| 5,712,577 A | * | 1/1998 | Cho | 326/38 |
| 5,838,625 A | * | 11/1998 | Cutter et al. | 365/225.7 |
| 6,320,802 B1 | * | 11/2001 | Ohbayashi | 365/200 |
| 6,400,632 B1 | * | 6/2002 | Tanizaki et al. | 365/225.7 |
| 6,566,730 B1 | | 5/2003 | Giust et al. | 257/529 |
| 6,661,330 B1 | | 12/2003 | Young | 337/297 |

* cited by examiner

*Primary Examiner*—Anh Phung
(74) *Attorney, Agent, or Firm*—Thomas, Kayden, Horstemeyer & Risley

(57) ABSTRACT

A programming method for fuse cells. A core circuit is applied with a first power voltage. The fuse cell includes an electrical fuse element connected to a common node, and a driver device connected between the electrical fuse element and a ground node. The ground node has a ground voltage. The fuse cell has a control gate for controlling current through the electrical fuse element. In program mode, a second power voltage is applied to the common node, a first control voltage is applied to the control gate of a selected fuse cell and a second control voltage is applied to the control gate of an unselected fuse cell. In read mode, the first power voltage is applied to the common node. The second power voltage exceeds the first power voltage. The second control voltage exceeds the ground voltage. The second control voltage is also lower than the first control voltage.

42 Claims, 6 Drawing Sheets

PROGRAMMING METHOD FOR ELECTRICAL FUSE CELL AND CIRCUIT THEREOF

BACKGROUND OF THE INVENTION

1. Field of the Invention

The present disclosure relates in general to a programming method. In particular, the present disclosure relates to a programming method for electrical fuse cells and a circuit using the method.

2. Description of the Related Art

Fuse links are frequently used in conjunction with redundant memory cells of memory ICs or embedded memory segments in application specific integrated circuits (ASICs) or system level integrated circuits (SLICs). If a memory cell is defective, a redundant memory cell is substituted and the defective memory cell is disconnected. It is not unusual for IC memory chips or memory segments of ASICs or SLICs to be formed by hundreds of thousands, or millions, of such memory cells. With such a large number of memory cells, there is a significant risk that at least some of those memory cells will be defective when fabricated. Using programmable fuse link structures in memory segments of ASICs or SLICs, as well as in other parts of the IC, increases economic efficiency in IC fabrication by substantially raising the yield of functional circuits produced from the fabrication process. In addition, fuse links are also applied to chip ID setting and resistor trimming in chip design implementation.

The typical method of blowing, severing or opening a conventional fuse link involves focusing a laser beam on a fuse structure formed in the IC. The energy density and pulse duration of the laser beam deliver sufficient energy to the fuse link to vaporize or melt the fuse material, thereby severing or opening the pre-existing electrical path through the fuse link. Once the electrical path has been opened, current can no longer flow through it. The circuitry of the IC has been designed to respond to this open circuit by disconnecting defective circuit elements and inserting correctly functioning circuit elements.

U.S. Pat. No. 6,566,730 to Giust et al. discloses laser-breakable fuse links with alignment and break point promotion structures.

However, the large energy of the laser beam presents the possibility of thermal damage to adjoining circuitry of the IC. In addition, the ability to precisely position the laser beam is important, because a directly positioned laser beam will be more effective in melting the fuse link. Another consideration is to provide the smallest possible spot or diameter of a laser beam. Thus, the density of structures on the semiconductor device may be limited. To provide laser beams with precise location and appropriate diameter, the cost of the laser beam generator is uneconomical.

Another type of fuse link is an electrical fuse. U.S. Pat. No. 6,661,330 to Young et al. discloses electrical fuses for semiconductor integrated circuits. The electrical fuse has recently been emphasized as a means of replacing metal fuses to reduce testing and programming costs.

FIGS. 1A and 1B illustrate a top plane view and a cross-section, respectively, of a portion 10 of an integrated circuit (not shown) comprising a conventional fuse 15 prior to programming. FIG. 1A illustrates the fuse 15 formed over an insulation layer 12, wherein the fuse comprises two contacts 13A and 13B in electrical contact with an electrically conducting silicide layer 14. As illustrated in cross-section in FIG. 1B, the silicide layer 14 is disposed over a polysilicon layer 16, wherein the silicide layer 14 and the polysilicon layer 16 are generally arranged in a stack residing over the insulation layer 12. Typically, the insulation layer 12 is an oxide layer deposited or grown on a semiconductor substrate 18, such as monocrystalline silicon. Furthermore, the fuse 15 is generally covered with an insulative passivation layer 17 to electrically isolate the fuse from other devices (not shown).

During programming and operation, electrical current through the fuse 15 generally proceeds from one contact 13A, through the silicide layer 14, to the other contact 13B. If the current is increased to a level that exceeds a predetermined threshold current of the fuse 15, the silicide layer 14 will change its state, for example, by melting, thereby altering a resistance of the structure. Note that depending on the sensitivity of the sensing circuitry (e.g., a sense amp), a fuse may be considered "blown" if a change in resistance is only modest. Therefore the term "blowing" a fuse may be considered to broadly cover a modest alteration of the resistance or alternatively, may comprise a complete open circuit. FIG. 1C illustrates a cross section of the fuse 15 shown in FIG. 1B after the fuse has been programmed (e.g., a "blown" fuse), wherein the programming current has effectively melted or otherwise altered a state of the silicide layer 14 in a region, thereby forming a discontinuity 11 in the silicide layer, wherein agglomerations 19 of silicide are formed on either side of the discontinuity.

The programming of conventional electrical fuse requires I/O driver device with operating voltage in the range of 2.5V~3.3V, unlike the operating voltage of the core device. Thus, a level shifter is generally required to bridge the I/O drive device from the core device. In addition, to sustain the large programming current, the transistor of the conventional I/O drive device comprises a gate oxide thicker than that of the core device, thereby generally requiring additional process steps and mask layers for I/O driver device.

SUMMARY OF THE INVENTION

One object, among others, of the present invention is thus to provide an electrical fuse cell solution and programming scheme for the single core design approach.

To achieve the above-mentioned object, the present disclosure provides a programming method for fuse cells. A core circuit is applied with a first power voltage. The fuse cell includes an electrical fuse element connected to a common node. The fuse cell further includes a driver device connected between the electrical fuse element and a ground node. The ground node has a ground voltage. The fuse cell has a control gate for controlling current through the electrical fuse element. In program mode, a second power voltage is applied to the common node, and a first control voltage is applied to the control gate of a selected fuse cell. Additionally, in program mode, a second control voltage is applied to the control gate of an unselected fuse cell. In read mode, the first power voltage is applied to the common node. The second power voltage exceeds the first power voltage. The second control voltage exceeds the ground voltage. The second control voltage is also lower than the first control voltage.

In addition, the present invention provides a circuit for programming and reading an electrical fuse link. The circuit includes a core circuit and fuse cells. The core circuit is applied with a first power voltage. Each fuse cell includes an electrical fuse element connected to a common node. Each fuse cell further includes a driver device connected between the electrical fuse element and a ground node. The ground node has a ground voltage. Each fuse cell has a control gate for controlling current through the electrical fuse element. A power supply selectively applies either the first power voltage or a second power voltage to the common node according to a mode selection signal. The mode selection signal indicates whether the electrical fuse link operates in program mode or in read mode. A selector applies a first control voltage to the control gate of a selected fuse cell when the electrical fuse link is in program mode. The selector further applies a second control voltage to the control gate of an unselected fuse cell when the electrical fuse link is in program mode. The second power voltage exceeds the first power voltage. The second control voltage exceeds the ground voltage. The second control voltage is also lower than the first control voltage.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
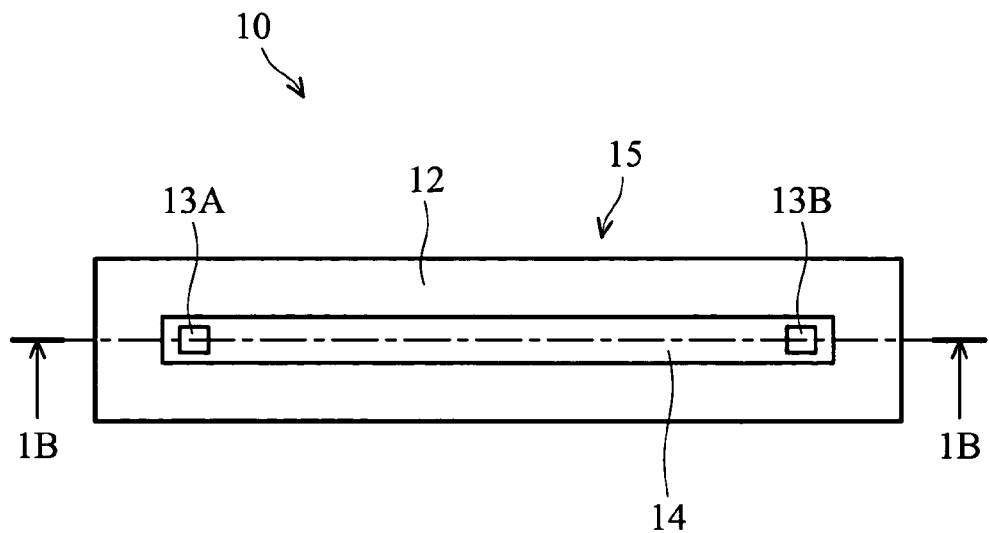
FIGS. 1A and 1B are a top plane view and a cross-section, respectively, of a conventional electrical fuse.
Figure 1B:
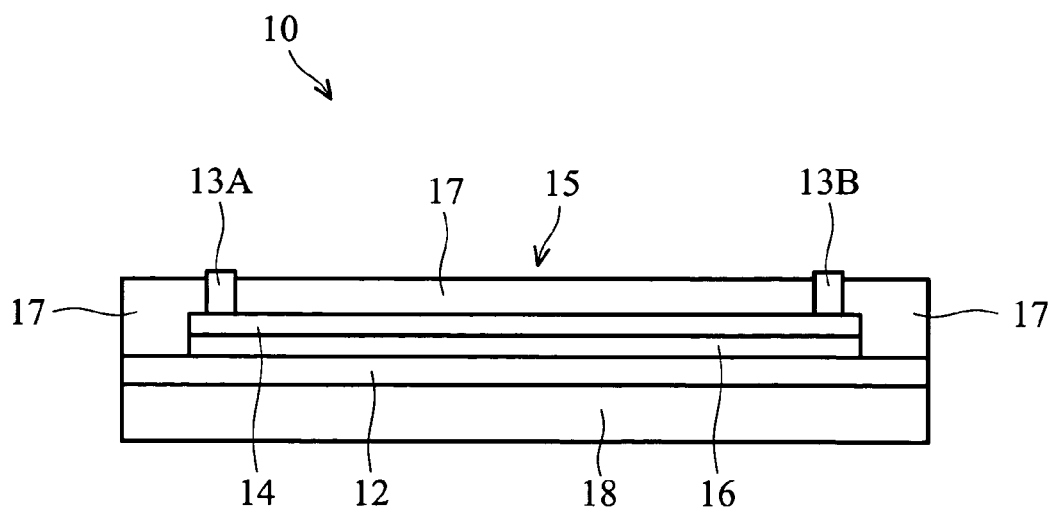
Figure 1C:
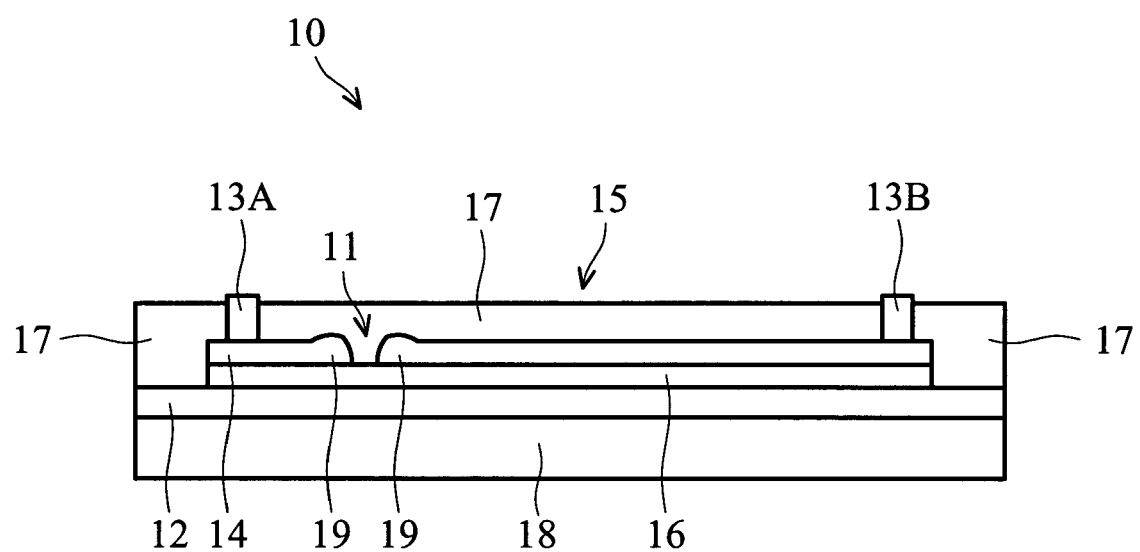
FIG. 1C is a cross section of the fuse 15 shown in FIG. 1B, after the fuse has been programmed.
Figure 2:
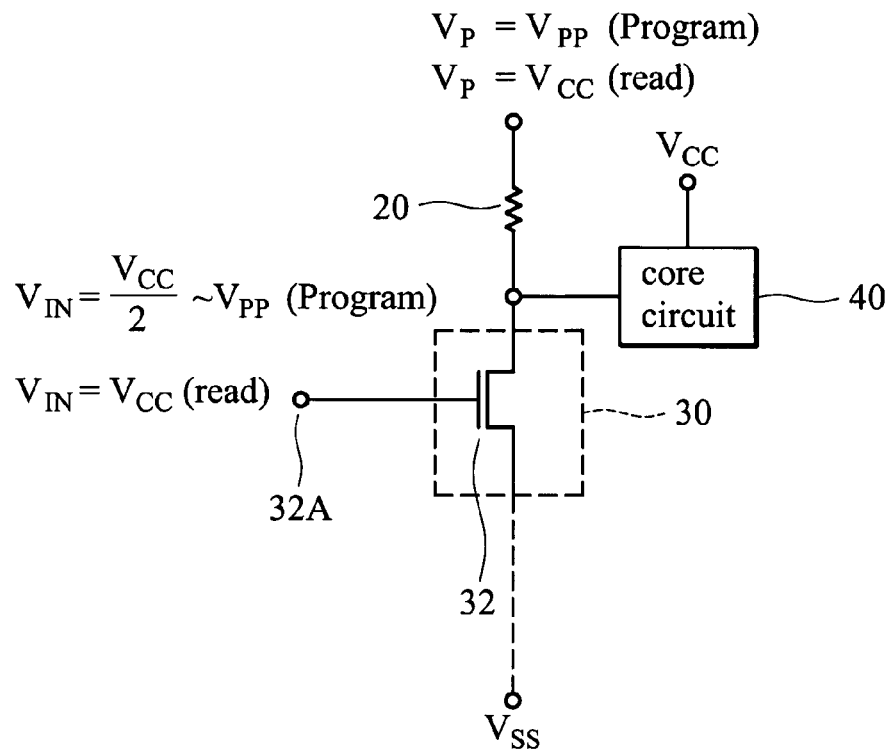
FIG. 2 is a schematic diagram of voltage applied to the fuse cell in read mode and program mode, respectively.

FIG. 2 is a schematic diagram of voltage applied to the fuse cell in program mode as being selected and in read mode, respectively. The electrical fuse 20 is coupled to a driver device 30, and the core circuit 40 is coupled to the connection point of the electrical fuse 20 and the driver device 30. Here, electrical fuse 20 and the driver device 30 comprise an electrical fuse cell. The electrical fuse cell is used for memory repair, chip ID setting or resistor trimming in chip design implementation, depending on the type of the core circuit 40. It is noted that the electrical fuse cell and the core circuit 40 are operated at an operating voltage $V_{CC}$ during normal operation. In addition, if the electrical fuse cell, which includes the electrical fuse 20 and the driver device 30, is in program mode, programming voltage $V_{PP}$ is applied to the electrical fuse 20, and the voltage applied to the control gate 32A of switch device 32 is between 0.5 times the operating voltage $V_{CC}$ and programming voltage $V_{PP}$. In read mode, operating voltage $V_{CC}$ is applied to the electrical fuse 20, and also to the control gate 32A of switch device 32.

Figure 3:
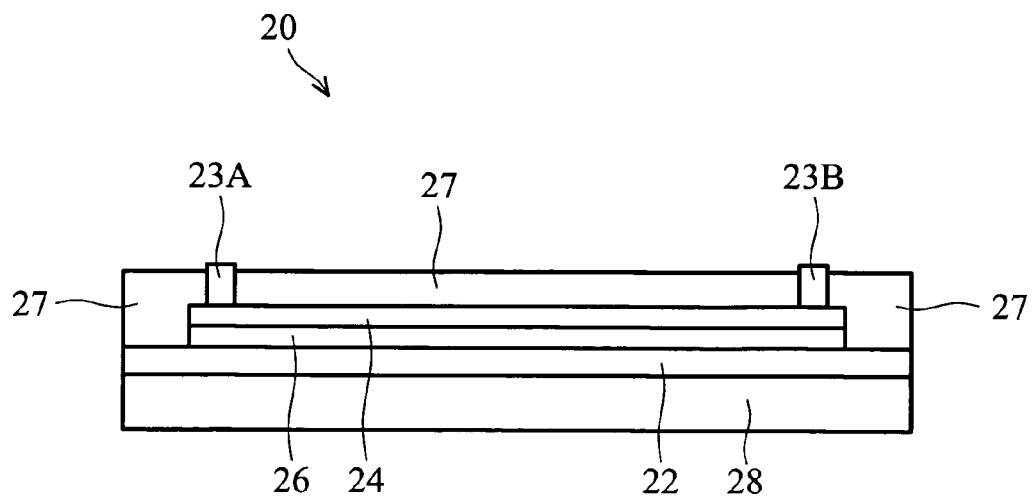
FIG. 3 is a cross-section of an electrical fuse.

FIG. 3 is a cross-section of an electrical fuse. The electric fuse comprises two contacts 23A and 23B which are in electrical contact with an electrically conducting silicide layer 24. The silicide layer 24 is formed over a polysilicon layer 26, wherein the silicide layer 24 and the polysilicon layer 26 are generally arranged in a stack residing over the insulation layer 22. Here, the material of the silicide layer 24 comprises $TiSi_2$, Ti, $CoSi_2$, Co, TiN, TaN, NiSi, Ni, PtSi, Pt, W, $WSi_2$, refractory metal or a combination thereof. The doped type of the polysilicon layer 24 comprises N-type, P-type, junction diode type or a combination thereof. Typically, the insulation layer 22 is an oxide layer deposited or grown on a semiconductor substrate 28. The material of the substrate comprises bulk-Si, SiGe, strain-Si, SOI, non-bulk Si or a combination thereof. Furthermore, the fuse 20 is generally covered with an insulative passivation layer 27 to electrically isolate the fuse from other devices (not shown). In one embodiment of the present invention, the electrical fuse 20 has a width less than 0.14 micrometers and a length less than 8 times the width.

As shown in FIG. 2, driver device 30 operates in an operating voltage $V_{CC}$. The device driver 30 comprises a control gate 32A and a switch device 32. The switch device 32 of the device drive 30 is coupled to the electrical fuse 20. In the embodiment of FIG. 2, the switch device 32 is an NMOS transistor including a gate oxide layer having a thickness less than approximately 20 angstroms. The material of the gate oxide layer comprises $SiO_2$, SiON, nitrogen content oxide layer, nitrided oxide, Hf content oxide, Ta content oxide, Al content oxide, high K material (for example, material of K>5) or a combination thereof. The drain of the NMOS transistor is coupled to the electrical fuse 20, and the source of the NMOS transistor is coupled to the grounding voltage $V_{SS}$. The NMOS transistor is turned on when the voltage level of the control gate 32A reaches a threshold voltage. Here, the threshold voltage is about 0.5 times the operating voltage $V_{CC}$, and the operating voltage $V_{CC}$ is between about 0.7 volts and about 1.4 volts. In addition, the driver device may be cascaded with core devices, multiple stage core transistors, I/O devices and an enhanced gate dielectric thickness device, which all operate in the operating voltage $V_{CC}$ in read mode. The cascade configuration of core devices resists the high voltage stress during programming. In addition, the NOMS transistor 32 comprises a special drain structure either with a well junction deepness of a drain between about 0.4 um and about 1.2 um or a longer lightly doped drain having a length between about 0.20 um and about 0.8 um to provide high junction breakdown voltage. In addition, if the driver device comprises an I/O device, the gate oxide layer of the I/O device is between about 18 angstroms and 50 angstroms, which is thinner than that of the conventional I/O device.

Figure 4:
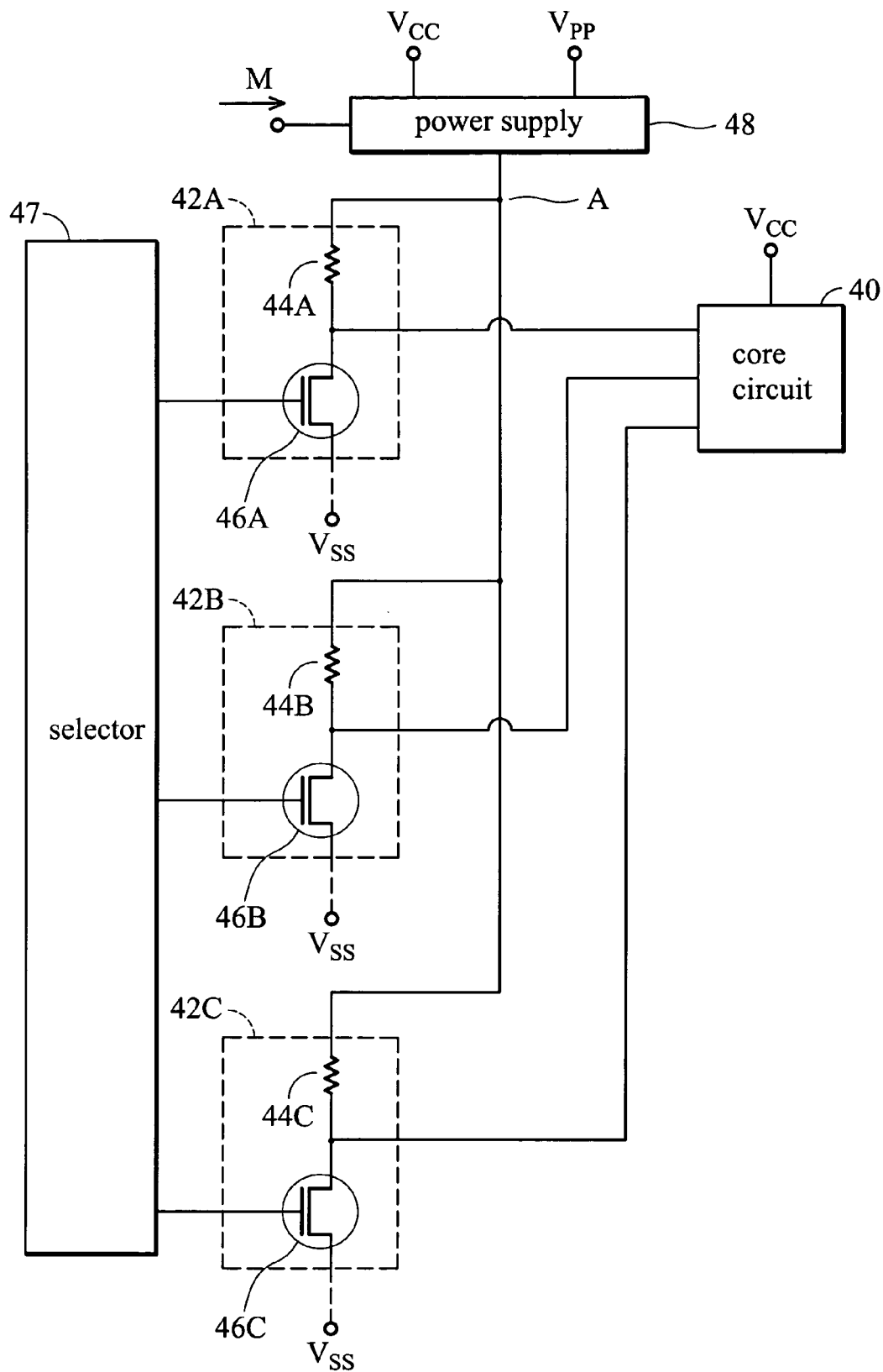
FIG. 4 is a circuit diagram for programming and reading electrical fuse cells according to embodiment of the present invention.

According to the present invention, the programming scheme for the single core design approach is described in FIG. 4. FIG. 4 is a circuit diagram for programming and reading electrical fuse cells according to an embodiment of the present invention. The circuit, as shown in FIG. 4, includes a core circuit 40 and a plurality of fuse cells (42A–42C). The core circuit 40 is applied with a first power voltage (operating voltage) $V_{CC}$. Each fuse cell comprises an electrical fuse element (44A, 44B or 44C) connected to a common node A. Each fuse cell further comprises a driver device (46A, 46B or 46C) connected between the electrical fuse element (44A, 44B or 44C) and a ground node $V_{SS}$. The ground node has a ground voltage. Each fuse cell further comprises a control gate for controlling current through the electrical fuse element. While the driver device shown in FIG. 4 is an NMOS transistor, it should be appreciated that the driver device can be other circuitry. Regardless of the choice of circuitry, the driver device comprises at least a switch having a control gate. For NMOS transistor embodiments, the control gates of the fuse cells are gates of the NMOS transistors. Power supply 48 selectively applies a first power voltage (operating voltage) $V_{CC}$ or a second power voltage (programming voltage) $V_{PP}$ to common node A as a function of a mode selection signal M. The mode selection signal M indicates whether the electrical fuse link is operating in program mode or in read mode. In program mode, selector 47 applies a first control voltage to the control gate of a selected fuse cell (fuse cell 42A as an example) and a second control voltage to the control gates of unselected fuse cells (fuse cells 42B and 42C as an example). Here, the second power voltage exceeds the first power voltage. The second control voltage exceeds the ground voltage. Additionally, the second control voltage is lower than the first control voltage. The reason of using the second control voltage exceeding the ground voltage is to avoid the voltage difference between the gate and the drain of NMOS transistors 46B and 46C of the unselected fuse cells too large, causing their gate oxide layers broken.

Figure 5A:
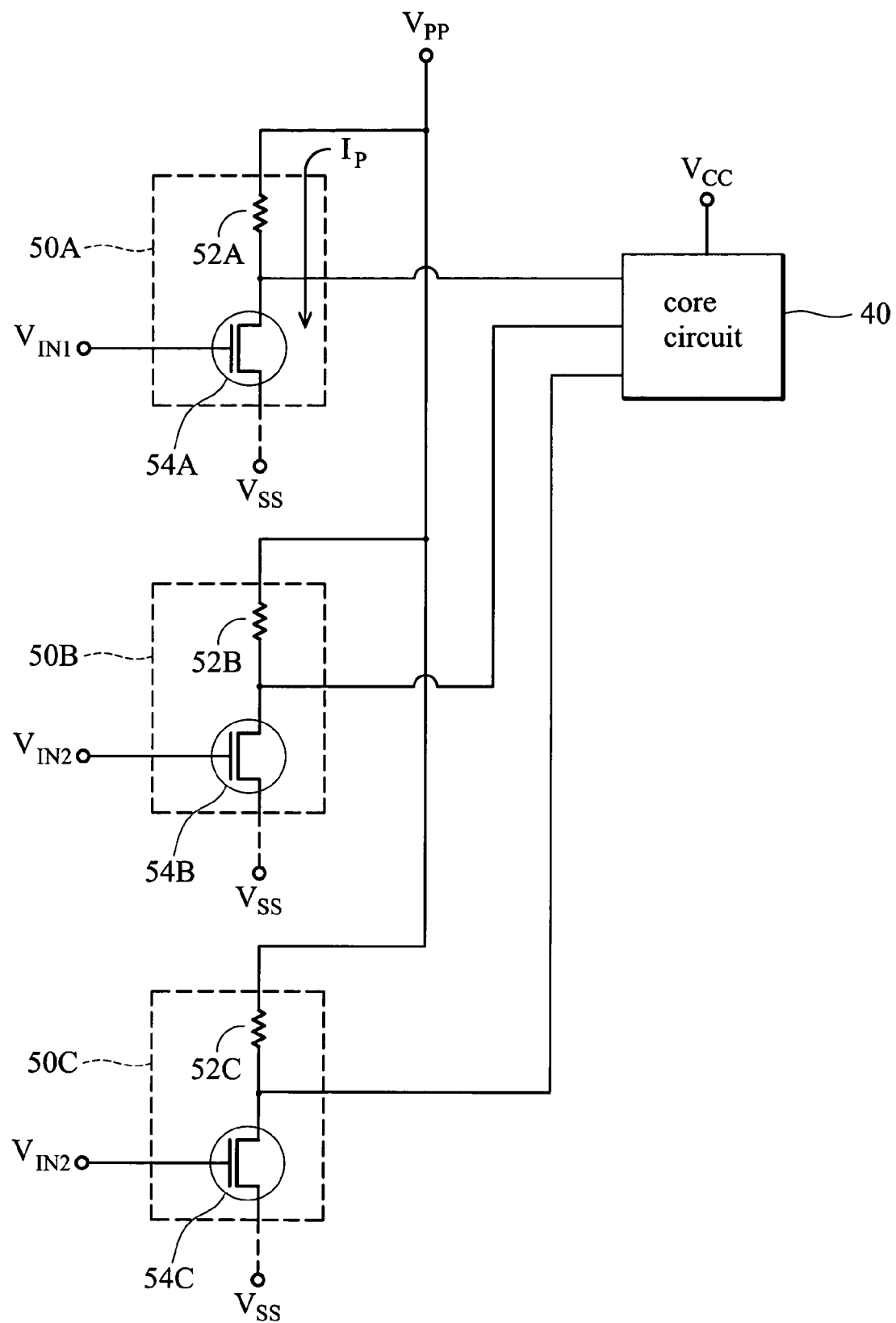
FIGS. 5A and 5B are circuit diagrams of the electrical fuse cells in program mode and read mode, respectively.
Figure 5B:
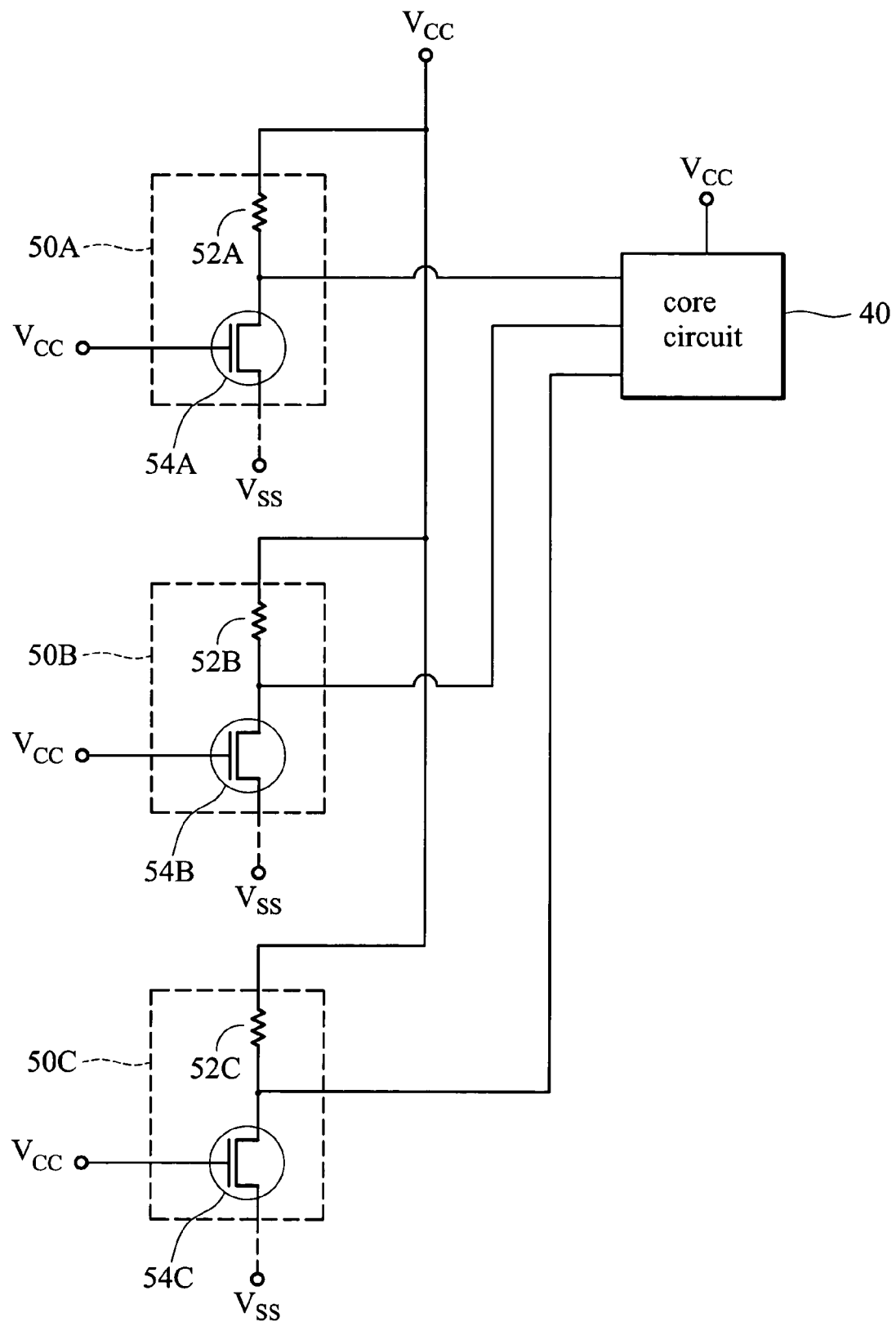

FIGS. 5A and 5B are circuit diagrams of the electrical fuse cells in program mode and read mode, respectively. In FIG. 5A, during program mode, the programming voltage $V_{PP}$ is applied to one terminal of the electric fuses 52A~52C. The voltage level of the programming voltage $V_{PP}$ is between about 1.4 and about 2.5 times the operating voltage $V_{CC}$. Assuming the electric fuse cell 50A is selected to be programmed, a first control voltage is applied to the gate of the NMOS transistor in the driver device 54A. Here, the voltage level of the first control voltage $V_{IN1}$ is between the threshold voltage of the NMOS transistor or 0.5 times the operating voltage VCC, and the programming voltage VPP. Thus, the electric fuse cell 50A is programmed by generating a programming current $I_P$ through the electric fuse 52A and the driver device 54A. The other driver devices 54B and 54C of the non-selected electric fuse cells 50B and 50C are turned off to prevent the electric fuse 52B and 52C from been programmed. It is noted that the gates of the NMOS transistors of the driver devices 54B and 54C receive the second control voltage $V_{IN2}$. $V_{IN2}$ exceeds the grounding voltage, but is less than the threshold voltage of the NMOS transistor. If the second control voltage $V_{IN2}$ is grounded, the voltage difference between the gate and the drain of the NMOS transistor may damage the gate oxide thereof, which is thin. Thus, some embodiments of the present invention increase the gate voltage level of the unselected fuse cells to decrease the voltage difference between the gate and the drain of the NMOS transistor, which is still in the off state. The voltage level of the second control voltage $V_{IN2}$ is between about 0.1 volts and about 0.7 volts.

In FIG. 5B, during read mode, the operating voltage $V_{CC}$ is applied to one terminal of the electric fuses 52A~52C and each gate of the driver devices 54A~54C. Thus, the electrical fuse cell and the core circuit operate at the same operating voltage $V_{CC}$.

Accordingly, the present disclosure provides a simple electrical fuse cell structure and programming scheme to facilitate the implementation of single core chip design approach, which saves the cost of process technology.

The foregoing description of the preferred embodiments of this invention has been presented for purposes of illustration and description. Obvious modifications or variations are possible in light of the above teaching. The embodiments were chosen and described to provide the best illustration of the principles of the invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A programming method for an electrical fuse link, comprising the following steps:
   providing a core circuit applied with a first power voltage;
   providing a plurality of fuse cells, each fuse cell comprising:
      an electrical fuse element connected to a common node; and
      a driver device connected between the electrical fuse element and a ground node, the ground node having a ground voltage, the driver device having a control gate for controlling current through the electrical fuse element;
   determining whether the fuse cells are in program mode or in read mode;
   in response to determining that the fuse cells are in program mode,
      applying a second power voltage to the common node, wherein the second power voltage exceeds the first power voltage;
      applying a first control voltage to the control gate of a selected fuse cell; and
      applying a second control voltage to the control gate of an unselected fuse cell, wherein the second control voltage exceeds the ground voltage, wherein the second control voltage is lower than the first control voltage; and
   in response to determining that the fuse cells are in read mode, applying the first power voltage to the common node.

2. The programming method as claimed in claim 1, wherein the electrical fuse element has a resistance and comprises a polysilicon layer formed on a substrate and a silicide layer formed on the polysilicon layer.

3. The programming method as claimed in claim 1, wherein the driver device comprises a switch device coupled to the electrical fuse element, wherein the switch device is turned on when the voltage level of the control gate reaches a threshold voltage.

4. The programming method as claimed in claim 3, wherein the first control voltage is between the threshold voltage and the second power voltage.

5. The programming method as claimed in claim 3, wherein the second control voltage is between the ground voltage and the threshold voltage.

6. The programming method as claimed in claim 2, wherein the current through the electrical fuse element of the selected fuse cell increases the resistance of the electrical fuse element.

7. The programming method as claimed in claim 2, wherein the voltage level of the second power voltage is between about 1.4 and about 2.5 times the first power voltage.

8. The programming method as claimed in claim 3, wherein the threshold voltage is about 0.5 times the first power voltage.

9. The programming method as claimed in claim 1, wherein the switch device is a transistor comprising a gate oxide layer having a thickness less than about 33 angstroms.

10. The programming method as claimed in claim 9, wherein the switch is an NMOS transistor comprising a gate coupled to the first control voltage or the second control voltage, a drain coupled to the electrical fuse element and a source coupled to the ground voltage.

11. The programming method as claimed in claim 1, wherein the driver device comprises a core device, an I/O device and an enhanced gate dielectric thickness device.

12. The programming method as claimed in claim 9, wherein the transistor comprises a deepness of a drain junction between about 0.4 um and 1.2 um.

13. The programming method as claimed in claim 9, wherein the transistor comprises a lightly doped drain having a length between about 0.2 um and 0.8 um.

14. The programming method as claimed in claim 1, wherein the driver device comprises a cascade of core transistors operated at the first power voltage.

15. The programming method as claimed in claim 1, wherein the driver device comprises multiple stage core transistors operated at the first power voltage.

16. The programming method as claimed in claim 1, wherein the switch device is a transistor comprising a gate oxide layer having a thickness less than about 20 angstroms.

17. The programming method as claimed in claim 2, wherein the polysilicon layer comprises a material selected from the group consisting of:
N-type, P-type, junction diode type, and a combination thereof.

18. The programming method as claimed in claim 1, wherein the second control voltage is between about 0.1 volts and about 0.7 volts.

19. The programming method as claimed in claim 1, wherein the first control voltage is greater than about 0.5 times the first power voltage, wherein the first control voltage is less than the second power voltage.

20. The programming method as claimed in claim 1, wherein the first power voltage is between about 0.7 volts and about 1.4 volts.

21. The programming method as claimed in claim 1, wherein the driver device comprises an I/O transistor.

22. The programming method as claimed in claim 21, wherein the I/O transistor comprises a gate oxide layer having a thickness between about 18 angstroms and about 50 angstroms.

23. The programming method as claimed in claim 1, wherein the electrical fuse element has a width less than about 0.14 micrometers.

24. The programming method as claimed in claim 23, wherein the electrical fuse element has a length less than about 8 times the width.

25. The programming method as claimed in claim 9, wherein the material of the gate oxide layer comprises a material selected from the group consisting of:
$SiO_2$, SiON, nitrogen content oxide layer, nitrided oxide, Hf content oxide, Ta content oxide, Al content oxide, high K material (K>5), and a combination thereof.

26. The programming method as claimed in claim 16, wherein the gate oxide layer comprises a material selected from the group consisting of:
$SiO_2$, SiON, nitrogen content oxide layer, nitrided oxide, Hf content oxide, Ta content oxide, Al content oxide, high K material (K>5), and a combination thereof.

27. The programming method as claimed in claim 2, wherein the substrate comprises a material selected from the group consisting of:
bulk-Si, SiGe, strain-Si, SOI, non-bulk Si, and a combination thereof.

28. The programming method as claimed in claim 2, wherein the silicide layer comprises a material selected from the group consisting of:
$TiSi_2$, Ti, $CoSi_2$, Co, TiN, TaN, NiSi, Ni, PtSi, Pt, W, $WSi_2$, refractory metal, and a combination thereof.

29. A circuit for programming and reading an electrical fuse link, comprising:
a core circuit applied with a first power voltage;
a plurality of fuse cells, each fuse cell comprising:
an electrical fuse element connected to a common node; and
a driver device connected between the electrical fuse element and a ground node, the ground node having a ground voltage, the driver device having a control gate for controlling current through the electrical fuse element;
a power supply selectively applying the first power voltage or a second power voltage to the common node according to a mode selection signal, the mode selection signal being indicative of whether the electrical fuse link is operating in program mode or in read mode; and
a selector applying a first control voltage to the control gate of a selected fuse cell when the electrical fuse link is in program mode, wherein the selector further applies a second control voltage to the control gate of an unselected fuse cell when the electrical fuse link is in program mode, wherein the second power voltage exceeds the first power voltage, wherein the second control voltage exceeds the ground voltage, and wherein the second control voltage is lower than the first control voltage.

30. The circuit as claimed in claim 29, wherein the driver device comprises a switch device coupled to the electrical fuse element, wherein the switch device is turned on when the voltage level of the control gate reaches a threshold voltage.

31. The circuit as claimed in claim 30, wherein the first control voltage is between the threshold voltage and the second power voltage.

32. The circuit as claimed in claim 30, wherein the second control voltage is between the ground voltage and the threshold voltage.

33. The circuit as claimed in claim 29, wherein the voltage level of the second power voltage is between about 1.4 and about 2.5 times the first power voltage.

34. The circuit as claimed in claim 30, wherein the threshold voltage is about 0.5 times the first power voltage.

35. The circuit as claimed in claim 30, wherein the switch is an NMOS transistor comprising a gate coupled to the first control voltage or the second control voltage, a drain coupled to the electrical fuse element and a source coupled to the ground voltage.

36. The circuit as claimed in claim 29, wherein the driver device comprises at least core device, an I/O device and an enhanced gate dielectric thickness device.

37. The circuit as claimed in claim 29, wherein the driver device comprises a cascade of core transistors operated at the first power voltage.

38. The circuit as claimed in claim 29, wherein the driver device comprises multiple stage core transistors operated at the first power voltage.

39. The circuit as claimed in claim 29, wherein the second control voltage is between about 0.1 volts and about 0.7 volts.

40. The circuit as claimed in claim 29, wherein the first control voltage is greater than about 0.5 times the first power voltage, wherein the first control voltage is less than the second power voltage.

41. The circuit as claimed in claim 29, wherein the first power voltage is between about 0.7 volts and about 1.4 volts.

42. The circuit as claimed in claim 29, wherein the driver device is an I/O transistor.

* * * * *